US010251304B1

(12) United States Patent
Ivey

(10) Patent No.: US 10,251,304 B1
(45) Date of Patent: Apr. 2, 2019

(54) LIGHTWEIGHT ELECTRONICS RACK

(71) Applicant: Mitek Corp,. Inc., Phoenix, AZ (US)

(72) Inventor: Johnathan Ivey, Chandler, AZ (US)

(*) Notice: Subject to any disclaimer, the term of this patent is extended or adjusted under 35 U.S.C. 154(b) by 0 days.

(21) Appl. No.: 15/710,738

(22) Filed: Sep. 20, 2017

(51) Int. Cl.
*H05K 7/18* (2006.01)
*H05K 7/14* (2006.01)

(52) U.S. Cl.
CPC ........... *H05K 7/186* (2013.01); *H05K 7/1489* (2013.01)

(58) Field of Classification Search
CPC ........ H05K 7/186; H05K 7/1489; H05K 5/02; H05K 5/03; H05K 5/004; H05K 5/008; H05K 5/0013; H05K 5/00; H05K 5/003; G06F 1/181
See application file for complete search history.

(56) References Cited

U.S. PATENT DOCUMENTS

| | | | | |
|---|---|---|---|---|
| 4,166,565 A * | 9/1979 | Webinger | ............ | A61L 9/12 229/108 |
| 5,419,629 A * | 5/1995 | Korinsky | ............ | G06F 1/182 312/223.2 |
| 5,460,441 A * | 10/1995 | Hastings | ............ | G06F 1/184 312/138.1 |
| 5,692,672 A * | 12/1997 | Hunt | ............ | B65D 5/06 229/128 |
| 5,709,913 A * | 1/1998 | Andersen | ............ | B29C 43/24 206/524.7 |
| 6,018,456 A * | 1/2000 | Young | ............ | G06F 1/181 361/679.4 |
| 6,168,249 B1 * | 1/2001 | Chien | ............ | A47B 47/03 312/223.2 |
| 6,209,973 B1 * | 4/2001 | Steinberg | ............ | G06F 1/1601 312/204 |
| 6,496,366 B1 * | 12/2002 | Coglitore | ............ | G06F 1/18 174/377 |
| 8,498,113 B2 * | 7/2013 | Tran | ............ | H03M 13/1102 174/50 |
| 8,830,223 B2 * | 9/2014 | Evans | ............ | G06F 17/50 345/419 |
| 9,395,508 B1 * | 7/2016 | Dailey | ............ | G02B 6/4471 |
| 9,609,778 B1 * | 3/2017 | Spencer | ............ | G06F 1/183 |
| 9,769,947 B1 * | 9/2017 | Sands | ............ | H05K 7/1491 |
| 2005/0128722 A1 * | 6/2005 | Miller | ............ | H04Q 1/06 361/797 |
| 2005/0168929 A1 * | 8/2005 | Inoue | ............ | G06F 1/181 361/679.34 |

(Continued)

*Primary Examiner* — Hanh V Tran
(74) *Attorney, Agent, or Firm* — Keith L. Jenkins, Registered Patent Attorney, LLC; Keith L. Jenkins

(57) ABSTRACT

A lightweight plastic housing with metal rack rails attached within to support industry-standard electronics modules. The plastic is preferably corrugated plastic folded from a single cut sheet and secured with adhesive. The sheet is folded to make an enclosure having a rectangular cross section, and a fifth short panel overlaps a first panel. Box closures, possibly auto-locking box closures, form the top and bottom of the housing. Metal rack rails and supports for the rack rails are installed through a front opening of the housing and are attached to and supported by the plastic housing. Supports include lengths of asymmetric channel stock extending between the top and the bottom of the housing at four corners to maintain the rack rails spaced apart from the sides of the housing. Upper and lower cross supports extend between front and rear supports.

20 Claims, 7 Drawing Sheets

(56) References Cited

U.S. PATENT DOCUMENTS

| | | | | |
|---|---|---|---|---|
| 2006/0102575 A1* | 5/2006 | Mattlin | ............... | G06F 1/181 |
| | | | | 211/189 |
| 2006/0207212 A1* | 9/2006 | Durney | ............... | E04B 2/78 |
| | | | | 52/846 |
| 2006/0215358 A1* | 9/2006 | Campbell | ............... | G06F 1/181 |
| | | | | 361/679.57 |
| 2007/0278915 A1 | 12/2007 | Conrardy et al. | | |
| 2012/0091075 A1* | 4/2012 | Chapel | ............... | H05K 7/1489 |
| | | | | 211/26 |
| 2012/0153785 A1* | 6/2012 | Lai | ............... | B65D 5/4204 |
| | | | | 312/223.2 |
| 2013/0143478 A1* | 6/2013 | Arcos | ............... | H02B 13/025 |
| | | | | 454/184 |
| 2013/0162125 A1* | 6/2013 | Liang | ............... | H05K 7/1489 |
| | | | | 312/223.2 |
| 2013/0229096 A1* | 9/2013 | Wright | ............... | H05K 7/186 |
| | | | | 312/223.2 |
| 2013/0229754 A1* | 9/2013 | Liu | ............... | H05K 7/1489 |
| | | | | 361/679.02 |
| 2013/0242503 A1* | 9/2013 | Yi | ............... | H05K 7/20709 |
| | | | | 361/679.48 |
| 2014/0167582 A1* | 6/2014 | King | ............... | H02B 3/00 |
| | | | | 312/283 |
| 2014/0240920 A1* | 8/2014 | Cox | ............... | G06F 1/20 |
| | | | | 361/679.53 |
| 2014/0329454 A1* | 11/2014 | Liang | ............... | H05K 7/1404 |
| | | | | 454/184 |
| 2015/0216071 A1* | 7/2015 | Fan | ............... | H05K 7/1489 |
| | | | | 384/21 |
| 2015/0313036 A1* | 10/2015 | Li | ............... | H05K 7/1489 |
| | | | | 312/223.2 |
| 2015/0359128 A1* | 12/2015 | Bailey | ............... | H05K 7/1487 |
| | | | | 361/679.46 |
| 2016/0135325 A1* | 5/2016 | Chen | ............... | A47B 96/067 |
| | | | | 312/334.1 |
| 2016/0278243 A1* | 9/2016 | Bach | ............... | H05K 7/20736 |
| 2016/0316585 A1* | 10/2016 | Lu | ............... | H05K 7/1489 |
| 2016/0349804 A1* | 12/2016 | Xiao | ............... | G06F 1/182 |
| 2017/0094827 A1* | 3/2017 | Wilson | ............... | H05K 7/1489 |
| 2017/0150636 A1* | 5/2017 | Segroves | ............... | H05K 7/1489 |
| 2017/0223864 A1* | 8/2017 | Jost | ............... | A47B 57/54 |
| 2018/0084907 A1* | 3/2018 | Chen | ............... | H05K 7/1489 |

* cited by examiner

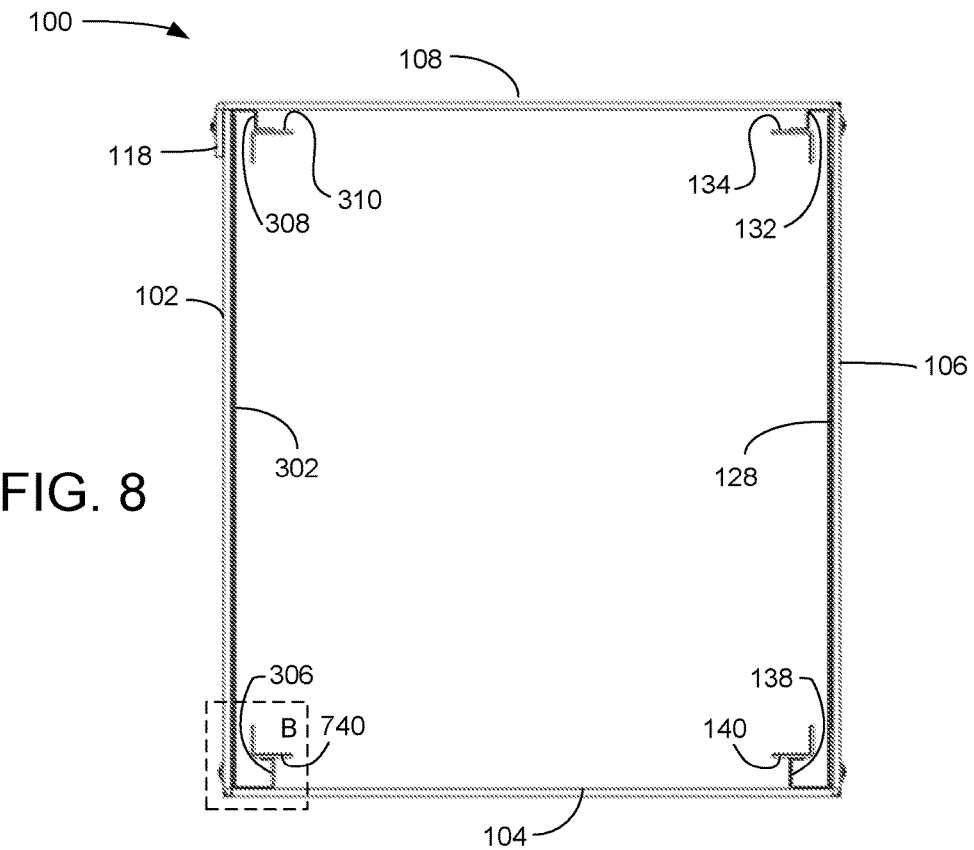
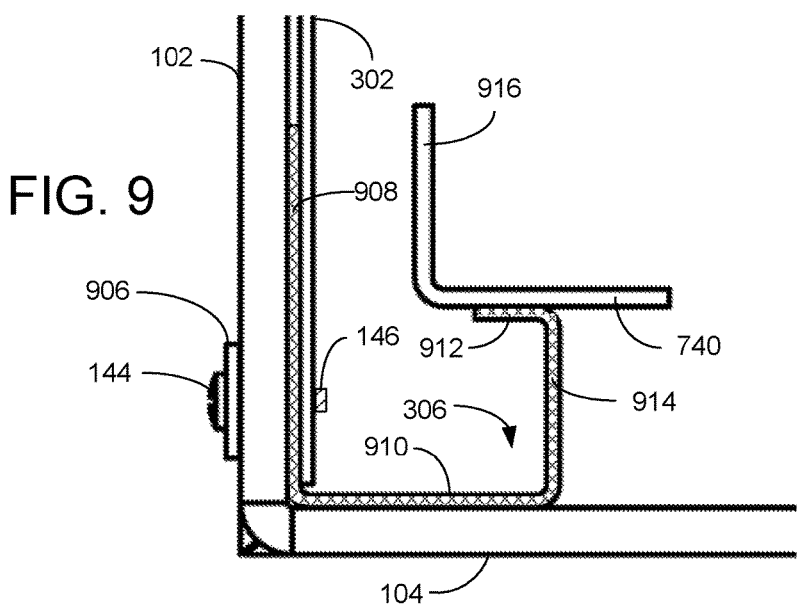

US 10,251,304 B1

LIGHTWEIGHT ELECTRONICS RACK

FIELD OF ART

The present invention relates to electronics racks for supporting electronic modules. The present invention more particularly relates to a lightweight electronics rack with a housing made of a single cut sheet of corrugated plastic.

BACKGROUND OF THE INVENTION

Industry standard electronics racks have been commercially available for many years and are used to hold electronics modules having industry-standard sizes. Examples of typical electronics modules include radio receivers, amplifiers, data processors, data recorders, and the like. Conventionally, industry standard electronics racks are made of metal, making them heavy and expensive.

SUMMARY OF THE INVENTION

Briefly described, the invention includes a plastic housing with metal rack rails attached within to fit industry-standard electronics modules. The plastic is preferably corrugated plastic folded from a single cut sheet and secured with adhesive. Metal rack rails and supports for the rack rails are installed through a front opening of the housing and are attached to the plastic housing.

DESCRIPTION OF THE FIGURES OF THE DRAWINGS

The present invention will hereinafter be described in conjunction with the following drawing figures, wherein like numerals denote like elements.

FIG. 8 is a cross sectional view through cross section AA illustrating the exemplary embodiment of the lightweight electronics rack of FIG. 1 and defining detail B, according to a preferred embodiment of the present invention; and FIG. 9 is a cross sectional view through cross section AA illustrating detail B of the exemplary embodiment of the lightweight electronics rack of FIG. 1, according to a preferred embodiment of the present invention.

DETAILED DESCRIPTION OF THE INVENTION

Figure 1:
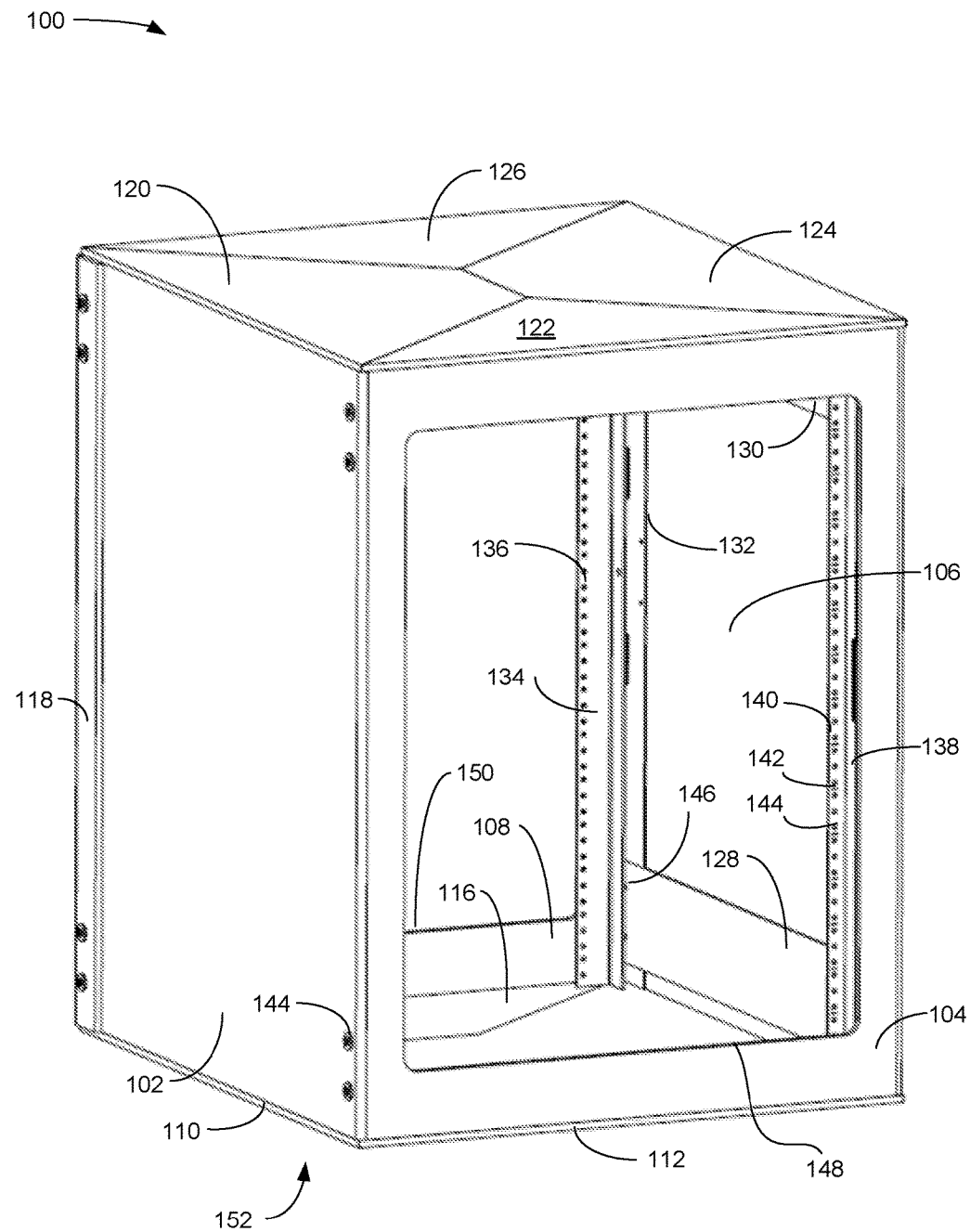
FIG. 1 is a perspective view illustrating an exemplary embodiment of a lightweight electronics rack, according to a preferred embodiment of the present invention.

FIG. 1 is a perspective view illustrating an exemplary embodiment of a lightweight electronics rack 100, according to a preferred embodiment of the present invention. Lightweight electronics rack 100 includes a housing 152 and hardware 300 (see FIG. 3). Housing 152 is preferably made of a single cut and folded corrugated plastic sheet 400 (See FIG. 4). Housing 152 has left side panel 102, front panel 104 with opening 148, right side panel 106, rear panel 108 with opening 150, and short panel 118 that is adhered to left side panel 102. Panels 102, 104, 106, 108, and 118 are of one piece, folded at the corners, as shown. Top auto-locking flaps 120, 122, 124, and 126 are of one piece with panels 102, 104, 106, and 108, respectively, and are shown in the locked position. Preferably, flaps 120, 122, 124, and 126 are permanently adhered to one another. Bottom auto-locking flaps 110, 112, 414 (see FIG. 4), and 116 are also of one piece with panels 102, 104, 106, and 108, respectively, and are shown in the locked position. While top auto-locking flaps 120, 122, 124, and 126 and bottom auto-locking flaps 110, 112, 414 (see FIG. 4) are preferred, various embodiments may use respective various corrugated box closures that provide similar strength and ease of assembly. Short flap 118 is folded onto left side panel 102 and adhered to left side panel 102. Fasteners 144 (one labeled of eight visible of sixteen used), illustrated as screws 144, attach hardware 300 to the housing 152.

Portions of hardware 300 (see FIG. 3) are shown installed. Front right vertical attachment rail 140, used for attaching and supporting electronics modules, such as electronics module 502 (see FIG. 5), is supported by front right channel column 138, which has a fin, similar to fin 908 (see FIG. 9), positioned between right side panel 106 and lower right column support 128 and clamped in place with two fasteners 144 (not visible in this view). Front right vertical attachment rail 140 has holes 144 for receiving fasteners for attaching electronics modules 502 (see FIG. 5) and has delineators 142 for aligning electronics modules (see FIG. 5). Rear right vertical attachment rail 134 is supported by right rear channel column 132. Exemplary right rear channel column 132 is a length of asymmetric channel stock that extends between the internal top and bottom surfaces of the housing 152. Right rear channel column 132 has a fin, similar to fin 908 (see FIG. 9), positioned between right side panel 106 and lower column support 128 and clamped in place with two fasteners 144 (one of two tip ends 146 of fasteners 144 labeled). In a particular embodiment, exemplary right rear channel column 132 may have a foot at the bottom and/or the top end. Upper right column support 130 is similarly configured with front right channel column 138 and right rear channel column 132.

Figure 2:
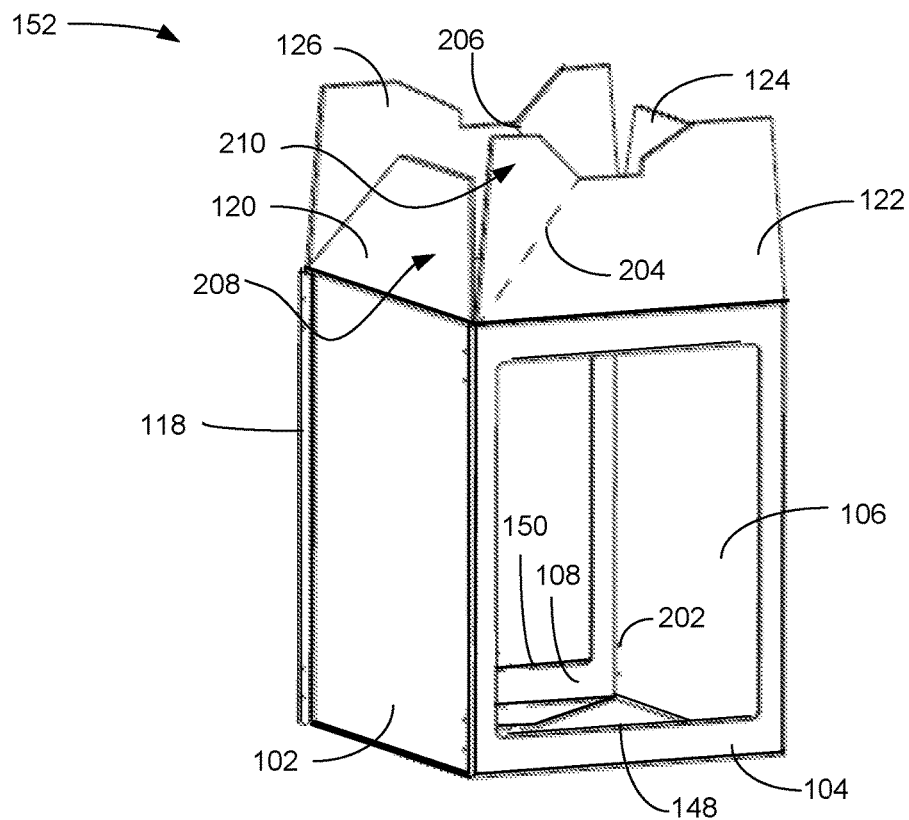
FIG. 2 is a perspective view illustrating the exemplary embodiment of the lightweight electronics rack housing of FIG. 1 in a stage of assembly, according to a preferred embodiment of the present invention.

FIG. 2 is a perspective view illustrating the exemplary embodiment of the lightweight electronics rack housing 152 of FIG. 1 in a stage of assembly, according to a preferred embodiment of the present invention. Flaps 122 and 126 have alignment marks 204 and 206, respectively. Top auto-locking flaps 120, 122, 124, and 126 are configured to be closed by placing a right-hand portion of each flap under a left-hand portion of its right-hand neighbor. For example, right portion 208 of flap 120 is placed under left hand portion 210 of flap 122, and so on around the top of the housing 152. Hardware 300 has not been installed at the illustrated stage, so pre-drilled housing fastener holes 202 (one labeled of ten visible of twenty) are shown (see FIG. 4).

Figure 3:
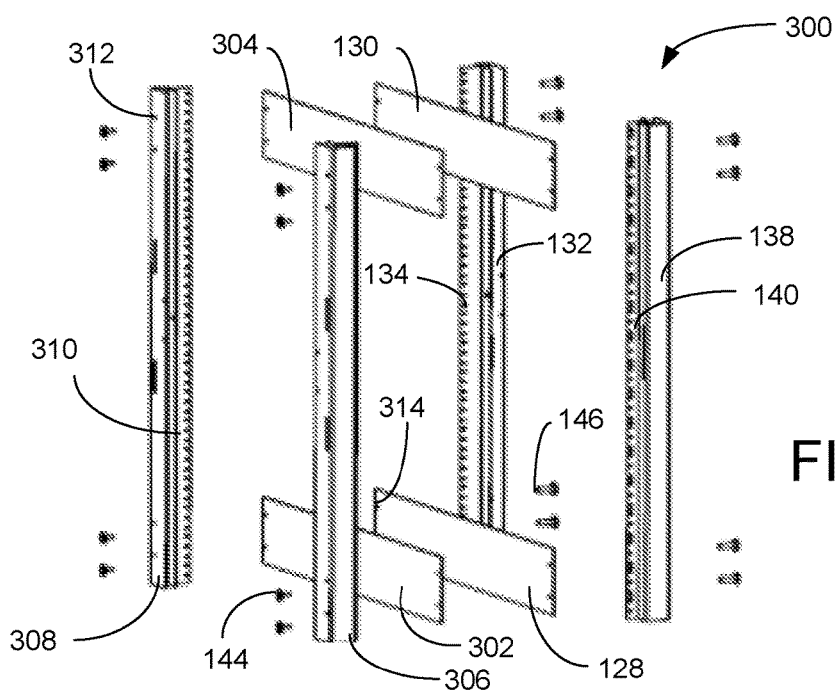
FIG. 3 is a perspective view illustrating an exemplary embodiment of hardware to be installed in the housing of lightweight electronics rack of FIG. 1, according to a preferred embodiment of the present invention.

FIG. 3 is a perspective view illustrating an exemplary embodiment of hardware 300 to be installed in the housing 152 of lightweight electronics rack 100 FIG. 1, according to a preferred embodiment of the present invention. Lower right column support 128 is shown with pre-drilled column support fastener holes 314 (one labeled of three visible of four). Upper right column support 130, upper left column support 304, and lower left column support 302 have similar pre-drilled column support fastener holes 314, all alignable to predrilled column fastener holes 312 (one labeled of eight visible of sixteen) in channel columns 308, 306, 138, or 132. In embodiments where the fasteners 146 (one labeled of sixteen) are screws, predrilled column fastener holes 312 are preferably threaded for screws. Column supports 128, 130, 302 and 304 are preferably metal, but made be made of any material having the necessary strength and rigidity. Left rear channel column 308 supports left rear vertical attachment rail 310. Left front channel column 306 supports left front vertical attachment rail 740 (see FIG. 7).

Figure 4:
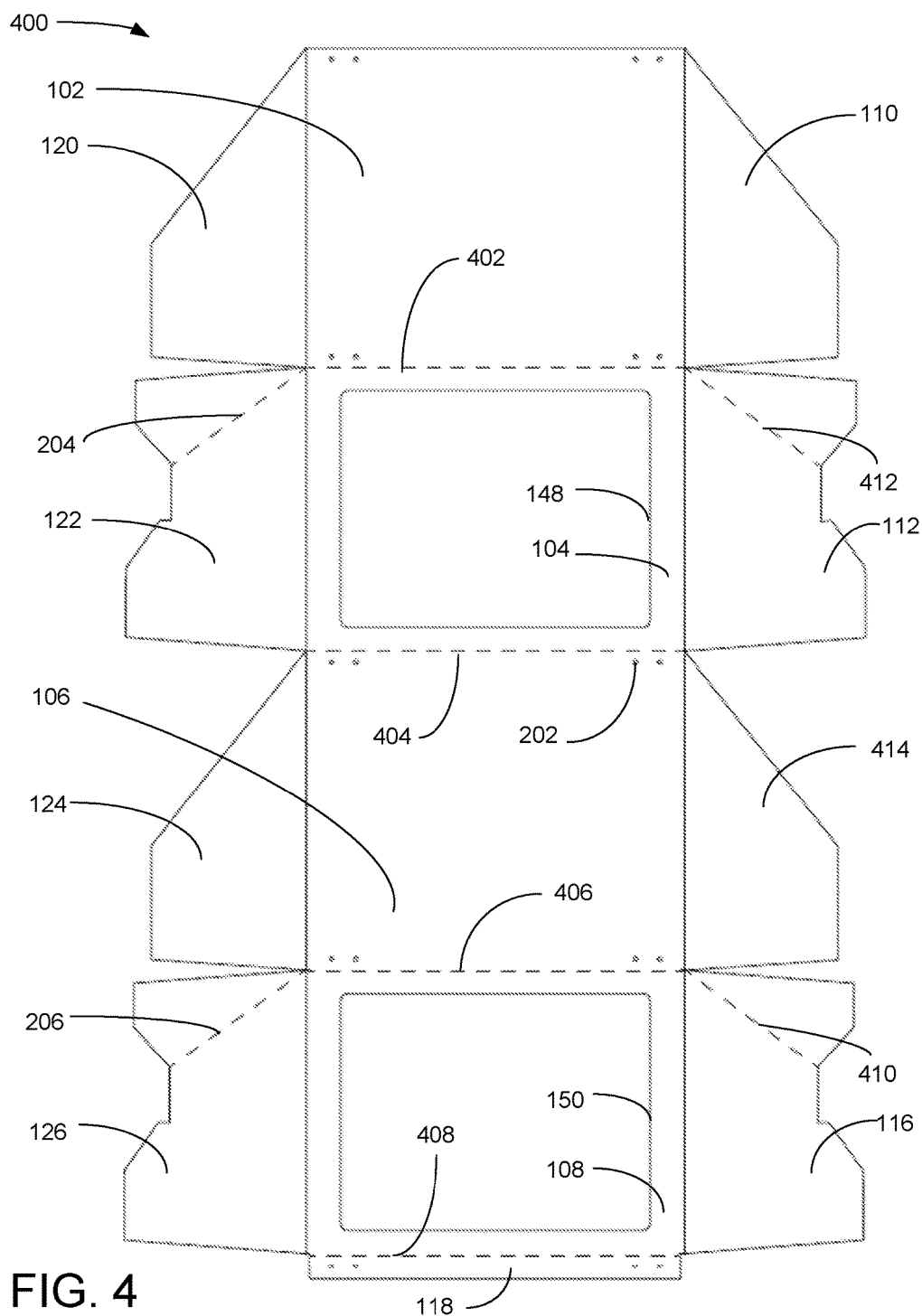
FIG. 4 is a top plan view illustrating an exemplary cut sheet of plastic which can be folded into the lightweight electronics rack housing of FIG. 1, according to a preferred embodiment of the present invention.

FIG. 4 is a top plan view illustrating an exemplary cut sheet of plastic 400 which can be folded into the lightweight electronics rack housing 152 of FIG. 1, according to a preferred embodiment of the present invention. Preferably, the cut sheet of plastic 400 is made of corrugated plastic. Fold lines 402, 404, 406, and 408 delineate panels 102, 104, 106, 108, and 118. Preferably, fold lines 402, 404, 406, and 408 are center lines for grooves to assist in folding. Cut sheet of plastic 400 features auto-locking box closures on the top and bottom of the housing 152. Alignment marks 410 and 412 on bottom flaps 116 and 112, respectively, perform the same function as alignment marks 204 and 206. Bottom flap 414 has the same function as flap 110. All twenty of the pre-drilled housing fastener holes 202 are visible in this view.

Figure 5:
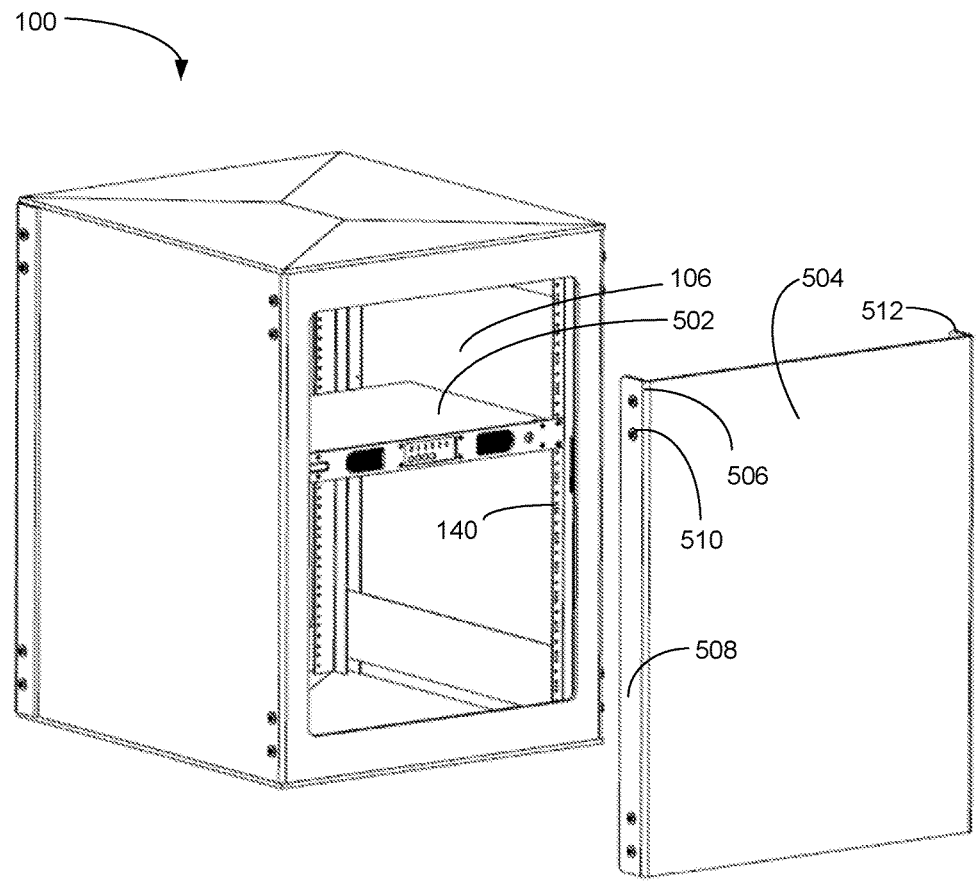
FIG. 5 is a perspective view illustrating the exemplary embodiment of the lightweight electronics rack of FIG. 1 in another stage of assembly, according to a preferred embodiment of the present invention.

FIG. 5 is a perspective view illustrating the exemplary embodiment of the lightweight electronics rack 100 of FIG. 1 in another stage of assembly, according to a preferred embodiment of the present invention. An exemplary electronics module 502 is shown installed in lightweight electronics rack 100. Front closure 504 is preferably made of a single piece of corrugated plastic with vertical flanges 508 and 512 having fastener openings 510 (one labeled of four visible of eight) alignable to predrilled housing fastener holes 202 near the front of housing 152. Front closure 504 may be used for security, storage, or transportation. In another embodiment, corner 506 is replaced by a hinge or hinges and a latch is provided from vertical flange 512 to housing panel 106.

Figure 6:
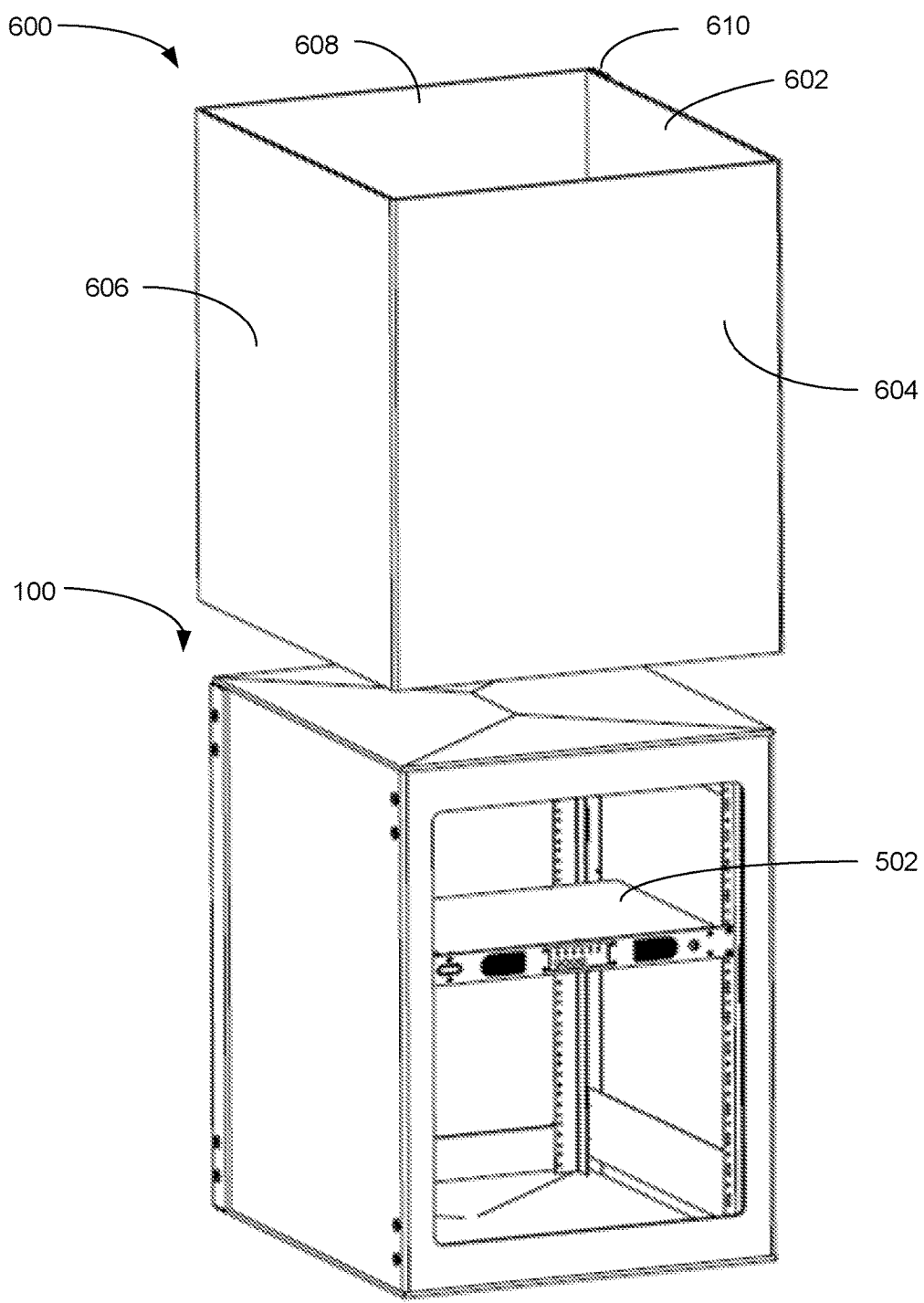
FIG. 6 is a perspective view illustrating the exemplary embodiment of the lightweight electronics rack of FIG. 1 with an enclosure, according to a preferred embodiment of the present invention.

FIG. 6 is a perspective view illustrating the exemplary embodiment of the lightweight electronics rack 100 of FIG. 1 with an enclosure 600, according to a preferred embodiment of the present invention. Enclosure 600 has five panels 602, 604, 606, 608, and 610 preferably folded from a single sheet of corrugated plastic into a sleeve with a rectangular cross section. Enclosure 600 is sized and configured to fit around lightweight electronics rack 100. In some embodiments, panel 608 may have openings for electrical and electronic cables. In some embodiments, enclosure 600 is releasably attachable to lightweight electronics rack 100. In some embodiments, enclosure 600 is used for shipping and storing the lightweight electronics rack 100.

Figure 7:
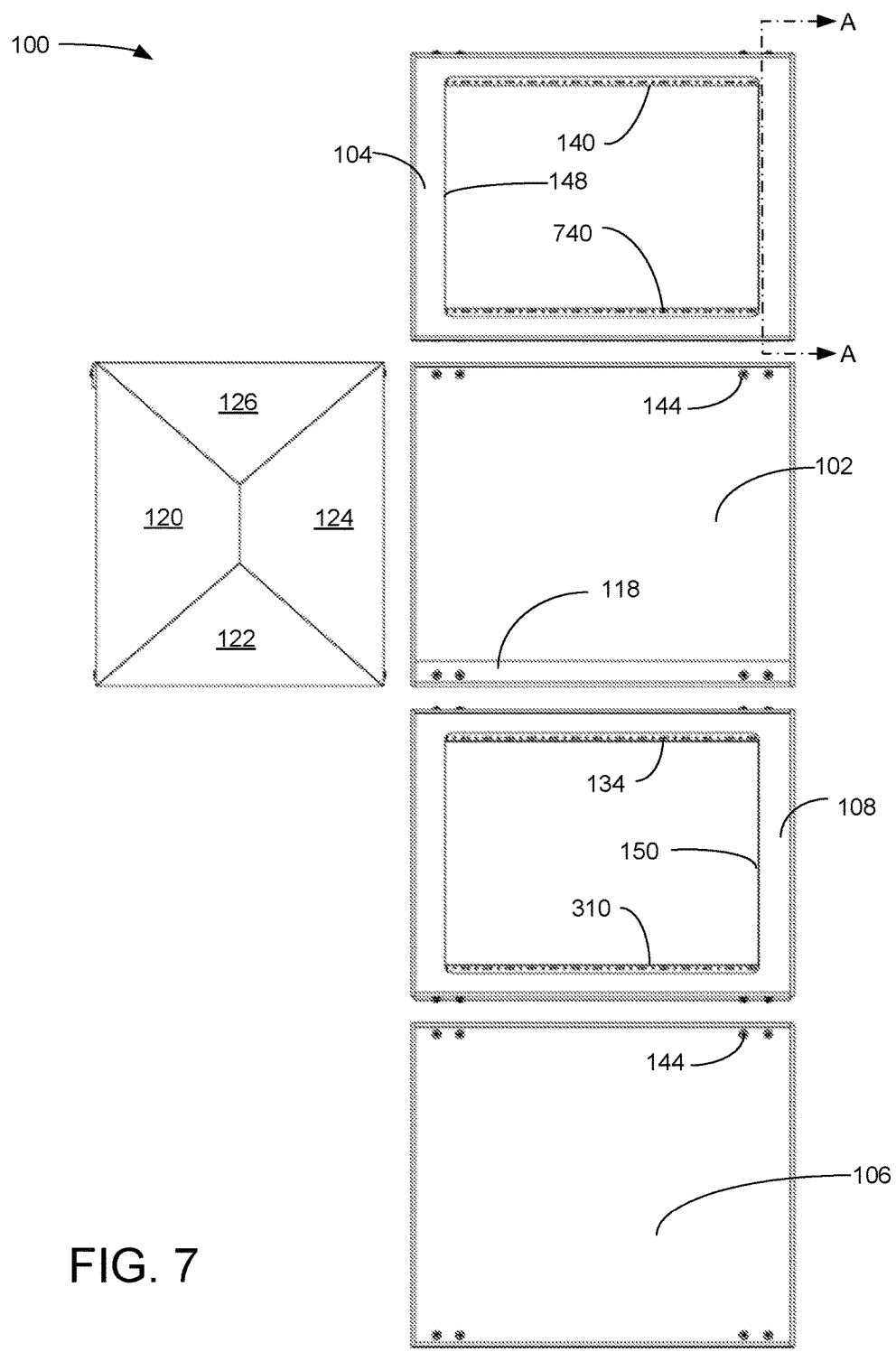
FIG. 7 is a top plan view and four elevation views illustrating the exemplary embodiment of the lightweight electronics rack of FIG. 1 and defining cross section AA, according to a preferred embodiment of the present invention.

FIG. 7 is a top plan view and four elevation views illustrating the exemplary embodiment of the lightweight electronics rack 100 of FIG. 1 and defining cross section AA, according to a preferred embodiment of the present invention. Panel 104 is shown with the front right vertical attachment rail 140 and the front left vertical attachment rail 740 in relation to front opening 148. Cross section AA is defined in relation to panel 104. Panel 102 is shown with panel 118 attached and eight fasteners 144 (one labeled of eight) for holding hardware 300 in place. Panel 108 is shown with the rear right vertical attachment rail 134 and the rear left vertical attachment rail 310 in relation to rear opening 150. Panel 106 is shown with eight fasteners 144 (one labeled of eight) for holding hardware 300 in place. Top panels 120, 122, 124, and 126 are shown in the final closed position.

FIG. 8 is a cross sectional view through cross section AA illustrating the exemplary embodiment of the lightweight electronics rack 100 of FIG. 1 and defining detail B, according to a preferred embodiment of the present invention. The channel columns 138, 132, 306 and 308 support vertical attachment rails 140, 134, 740, and 310, respectively, at a standoff distance from the internal surfaces of the walls 102, 104, 106, and 108 of the housing 152.

FIG. 9 is a cross sectional view through cross section AA illustrating detail B of the exemplary embodiment of the lightweight electronics rack 100 of FIG. 1, according to a preferred embodiment of the present invention. Left front vertical channel column 306 has a first channel side flange 908 that is sandwiched between panel 102 of housing 152 and lower left column support 302 and is fastened in place by fastener 144 using washer 906. Tip 146 of fastener 146 protrudes into the channel, as shown. Second channel side 910 is of one piece with first channel side flange 908, abuts panel 104, and extends away from panel 102. Third panel side 914 is of one piece with second channel side 910 and extends away from panel 104. Support flange 912 is of one piece with third panel side 914 and is attached to left front vertical attachment rail 740 which is made of angle stock 916 for rigidity. Thus, left front vertical channel column 306 provides a standoff distance from the panels 102 and 104 and attachment to panel 102.

While the embodiments herein have used corrugated plastic as the preferred material for the housing, some embodiments may use other lightweight materials having the required strength, low weight, and workability.

I claim:

1. A lightweight electronics rack comprising:
   a. a housing comprising a single cut sheet of material folded to make an enclosure having a plurality of panels;
   b. front and back openings in said housing sized and configured to receive electronics modules; and
   c. a plurality of vertical support rails mounted within said housing configured to mount said electronics modules;
   d. wherein said rails are spaced apart from interior surfaces of said panels of said housing.

2. The lightweight electronics rack of claim 1, comprising: a plurality of vertical channel columns supporting and spacing apart a respective said plurality of vertical support rails.

3. The lightweight electronics rack of claim 2, comprising a flange side of each said vertical channel column of said plurality of vertical channel columns positioned, when installed, to:
   a. abut an interior surface of one of a right side panel of said housing and a left side panel of said housing;
   b. attach to one of a right side panel of said housing and a left side panel of said housing; and c. attach to a lower column support and an upper column support.

4. The lightweight electronics rack of claim 2, wherein each vertical support rail of said plurality of vertical support rails comprises angle stock.

5. The lightweight electronics rack of claim 1, wherein said single cut sheet of material comprises a single cut sheet of corrugated plastic.

6. The lightweight electronics rack of claim 3, wherein said single cut sheet of material comprises a plurality of housing fastener holes.

7. The lightweight electronics rack of claim 6, comprising a plurality of column fastener holes in each said flange side of each said vertical channel column of said plurality of vertical channel columns, wherein said plurality of column fastener holes are alignable to a respective said plurality of housing fastener holes.

8. The lightweight electronics rack of claim 7, comprising a plurality of column support fastener holes in each end of each said column support alignable to a respective said plurality of said column fastener holes.

9. The lightweight electronics rack of claim 1, wherein said housing comprises:
   a. five vertical panels;
   b. a folding top box closure; and
   c. a folding bottom box closure.

10. The lightweight electronics rack of claim 9, wherein at least one of said folding top box closure and said folding bottom box closure comprises an auto-locking box closure.

11. The lightweight electronics rack of claim 1, wherein said housing comprises adhesive securing portions of said housing together.

12. A lightweight electronics rack comprising:
   a. a housing comprising a single cut sheet of material folded to make an enclosure having a plurality of panels;
   b. front and back openings in said housing sized and configured to receive electronics modules;
   c. a plurality of vertical support rails within said housing configured to mount said electronics modules;
   d. wherein said vertical support rails are spaced apart from interior surfaces of said plurality of panels of said housing; and
   e. a plurality of vertical channel columns supporting and spacing apart a respective said plurality of vertical support rails.

13. The lightweight electronics rack of claim 12, comprising a flange side of each said vertical channel column of said plurality of vertical channel columns positioned, when installed, to:
   a. abut an interior surface of one of a right side panel of said housing and a left side panel of said housing;
   b. attach to one of a right side panel of said housing and a left side panel of said housing; and
   c. attach to a lower column support and an upper column support.

14. The lightweight electronics rack of claim 12, wherein each vertical support rail of said plurality of vertical support rails comprises a portion of angle stock.

15. The lightweight electronics rack of claim 12, wherein said single cut sheet of material comprises:
   a. a single cut sheet of corrugated plastic;
   b. a plurality of housing fastener holes in three panels of said plurality of panels;
   c. a plurality of fold lines in said single cut sheet of corrugated plastic; and
   d. a plurality of alignment lines on said single cut sheet of corrugated plastic.

16. The lightweight electronics rack of claim 15, comprising a plurality of column fastener holes in each said flange side of each said vertical channel column of said plurality of vertical channel columns, wherein said plurality of column fastener holes are alignable to respective said plurality of housing fastener holes.

17. The lightweight electronics rack of claim 16, comprising a plurality of column support fastener holes in each end of each said column support alignable to a respective said plurality of said column fastener holes.

18. The lightweight electronics rack of claim 12, wherein said housing comprises:
   a. said plurality of panels further comprising four folded vertical panels having a rectangular cross section;
   b. a fifth short panel of said plurality of panels partially overlapping a first panel of said four panels;
   c. a folding top box closure extending from top edges of said four panels;
   d. a folding bottom box closure extending from bottom edges of said four panels; and
   e. an adhesive securing said short panel, said folding top box closure, and said folding bottom box closure.

19. A lightweight electronics rack comprising:
   a. a housing comprising a single cut sheet of corrugate plastic folded to make an enclosure having:
      i. four folded vertical panels having a rectangular cross section;
      ii. a fifth short panel overlapping a first panel of said four panels;
      iii. pre-drilled fastener openings in three panels of said five panels;
      iv. a folding top box closure extending from top edges of said four panels;
      v. a folding bottom box closure extending from bottom edges of said four panels; and
      vi. an adhesive securing said short panel, said folding top box closure, and said folding bottom box closure; and
   b. front and back openings in said housing sized and configured to receive electronics modules; and
   c. four vertical support rails made of angle stock within said housing configured to mount said electronics modules;
   d. wherein said four vertical support rails are each spaced apart from interior surfaces of said five panels of said housing; and
   e. four vertical channel columns supporting and spacing apart respective said four vertical support rails.

20. The lightweight electronics rack of claim 19, comprising a flange side of each said vertical channel column of said plurality of vertical channel columns positioned, when installed, to:
   a. abut an interior surface of one of a right side panel of said housing and a left side panel of said housing;
   b. attach to one of a right side panel of said housing and a left side panel of said housing; and
   c. attach to a lower column support and an upper column support.

\* \* \* \* \*